(12) United States Patent
Yeh et al.

(10) Patent No.: US 8,445,982 B2
(45) Date of Patent: May 21, 2013

(54) METHOD OF FORMING A SEMICONDUCTOR DEVICE

(75) Inventors: Chin-Tsan Yeh, Hsinchu (TW); Chun-Fu Chen, Taipei (TW); Yung-Tai Hung, Chiayi (TW); Chin-Ta Su, Yunlin Country (TW)

(73) Assignee: Macronix International Co., Ltd. (TW)

( * ) Notice: Subject to any disclaimer, the term of this patent is extended or adjusted under 35 U.S.C. 154(b) by 68 days.

(21) Appl. No.: 13/156,933

(22) Filed: Jun. 9, 2011

(65) Prior Publication Data

US 2012/0313214 A1   Dec. 13, 2012

(51) Int. Cl.
*H01L 21/76* (2006.01)
(52) U.S. Cl.
USPC ............................ 257/430; 438/690; 257/506
(58) Field of Classification Search
USPC ................. 438/691, 692, 298; 257/506
See application file for complete search history.

(56) References Cited

U.S. PATENT DOCUMENTS

| 6,677,224 | B2 * | 1/2004 | Tseng | 438/593 |
| 2002/0168819 | A1 * | 11/2002 | Tseng | 438/257 |
| 2008/0090352 | A1 * | 4/2008 | Lee et al. | 438/257 |

* cited by examiner

*Primary Examiner* — Phuc Dang
(74) *Attorney, Agent, or Firm* — Baker & McKenzie LLP

(57) ABSTRACT

A polysilicon structure and method of forming the polysilicon structure are disclosed, where the method includes a two-step deposition and planarization process. The disclosed process reduces the likelihood of defects such as voids, particularly where polysilicon is deposited in a trench having a high aspect ratio. A first polysilicon structure is deposited that includes a trench liner portion and a first upper portion. The trench liner portion only partially fills the trench, while the first upper portion extends over the adjacent field isolation structures. Next, at least a portion of the first upper portion of the first polysilicon structure is removed. A second polysilicon structure is then deposited that includes a trench plug portion and a second upper portion. The trench is filled by the plug portion, while the second upper portion extends over the adjacent field isolation structures. The second upper portion is then removed.

11 Claims, 5 Drawing Sheets

METHOD OF FORMING A SEMICONDUCTOR DEVICE

BACKGROUND

1. Technical Field

The present application relates to semiconductor technology, and more particularly to methods of depositing polysilicon and forming polysilicon structures.

2. Related Art

Polysilicon is a regularly used material in semiconductor processing in the fabrication of semiconductor devices. Examples of polysilicon structures include gate structures of a semiconductor transistors and semiconductor memory cells. Formation of these polysilicon structures should ideally result in a predictable structure in order to achieve desired device characteristics. However, as the scale of semiconductor devices continues to shrink, the formation of desirable polysilicon structures becomes increasingly challenging.

One specific example of a polysilicon structure is the floating gate of a flash memory device. Some floating gates are formed using self-alignment processes, whereby the gate structures are automatically aligned with neighboring isolation structures. An example of a process for manufacturing a self-aligned floating gate formed of polysilicon material is disclosed in U.S. Pat. No. 7,459,364 to Lee et al. ("Lee"), which is hereby incorporated herein by reference.

Lee discloses a process for achieving an intermediate semiconductor structure similar to the structure shown in FIG. 1. FIG. 1 shows a cross-sectional view of a semiconductor substrate 100 in which a series of field isolation structures 102 have been formed. The field isolation structures 102 are provided to isolate neighboring active regions. The field isolation structures 102 define a series of trenches 104, where gate structures will be formed. Turning next to FIG. 2, subsequent processing steps result in formation of a tunnel dielectric layer 106 and a conductive structure 108. The conductive structure 108 can include polysilicon that is formed by a deposition process, such as a Chemical Vapor Deposition (CVD) process. The manufacturing process could continue with material removal and planarization processes, such as CMP, for removing upper portions of the conductive structure 108, such that floating gates are formed between the field isolation structures 102 in the trenches 104.

However, as shown in FIG. 2, a defect in the form of a void 110 can sometimes occur during deposition of the polysilicon of the conductive structure 108. Such voids can occur because the polysilicon grows inward from the sidewalls of the field isolation structures 102 during the deposition process. As semiconductor devices continue to shrink, the aspect ratio (ratio of depth to width) of active-area trenches defined by neighboring isolation structures 102 tends to increase, which increases the likelihood that defects such as voids 110 can occur.

It would therefore be desirable to provide an improved polysilicon deposition process that decreases the likelihood that defects such as voids occur during a semiconductor manufacturing process.

SUMMARY

Polysilicon structures and methods associated with manufacturing polysilicon structures are described herein.

According to one aspect of the present disclosure, a method of forming a semiconductor device can comprise forming a first polysilicon structure that includes a trench liner portion and a first upper portion. The trench liner portion can be such that it only partially fills a first trench between adjacent field isolation structures, thereby resulting in formation of a second trench between the adjacent field isolation structures. Thus, the second trench can be at least partially defined by portions of the first polysilicon structure. The method can also include removing at least a portion of the first upper portion of the first polysilicon structure, and then forming a second polysilicon structure that includes a trench plug portion and a second upper portion, where the trench plug portion fills the second trench. The method can further include removing the second upper portion of the second polysilicon structure.

The forming of the first polysilicon structure can include polysilicon deposition. The forming of the first polysilicon structure can include forming a layer of polysilicon having a thickness that is less than half a width of the first trench. The removing of at least a portion of the first upper portion of the first polysilicon structure can include removing a thickness of the layer of polysilicon that is greater than B/4, where B is representative of the width of the first trench.

The first upper portion of the first polysilicon structure can be such that it extends over the adjacent field isolation structures. In such embodiments, the removing of at least a portion of the first upper portion of the first polysilicon structure can result in exposing at least a portion of an upper surface of at least one of the field isolation structures. Alternatively, in some embodiments, at least some of the first upper portion of the first polysilicon structure can remain over at least one of the field isolation structures after the removing of at least a portion of the first upper portion of the first polysilicon structure.

The removing of at least a portion of the first upper portion of the first polysilicon structure and/or the removing of the second upper portion of the second polysilicon structure can include removal of polysilicon by a Chemical Mechanical Planarization (CMP) process. In some such embodiments, the CMP process can include polishing using a slurry that comprises at least one of $SiO_2$ and $CeO_2$.

The second upper portion can extend over the adjacent field isolation structures. In some such embodiments, the removing of at least a portion of the second upper portion of the second polysilicon structure can include removing at least a portion of the first upper portion of the first polysilicon structure.

According to other aspects of the present disclosure, a semiconductor device comprises a first and second field isolation structures and a first trench between the first and second field isolation structures, the first trench being defined by the first and second field isolation structures. The semiconductor device also comprises first and second polysilicon structures. The first polysilicon structure can include a trench liner portion. The second polysilicon structure can include a trench plug portion. An interface between the first and second polysilicon structures can define a second trench between the first and second field isolation structures, and the trench plug portion can fill the second trench.

In some embodiments, the first polysilicon structure can include a layer of polysilicon having a thickness that is less than half a width of the first trench.

In some embodiments, a first thickness of the first polysilicon structure near a lower extent of the first trench can be greater than a second thickness of the first polysilicon structure near an upper extent of the first trench.

In some embodiments, a first width of the second trench near a lower extent of the second trench is greater than a second width of the second trench near an upper extent of the second trench.

These and other features, aspects, and embodiments are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

A detailed description of embodiments of the present application is provided with reference to the FIGS. 3-8.

Figure 1:
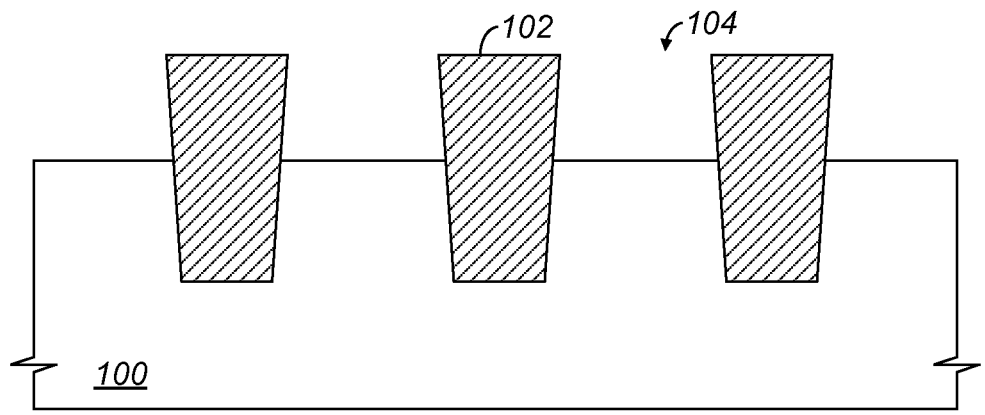
FIG. 1 shows a cross-sectional view of a conventional device comprising a semiconductor substrate in which a series of field isolation structures have been formed.
Figure 2:
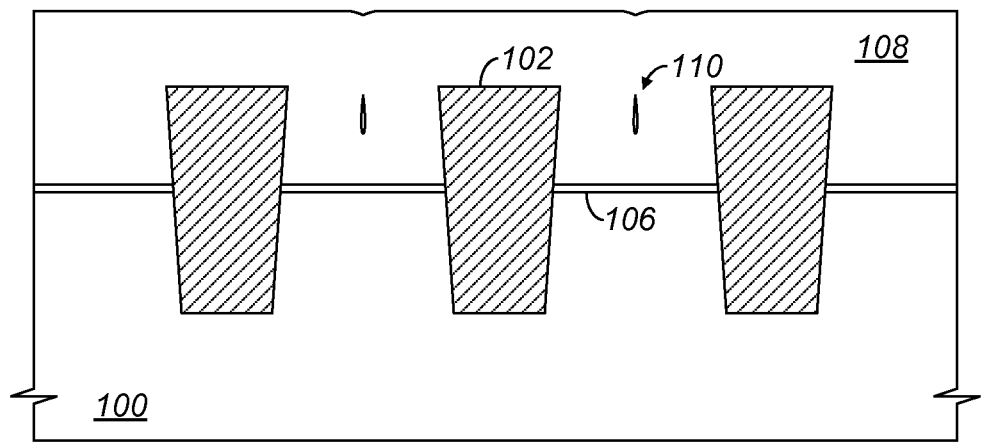
FIG. 2 shows the result of subsequent conventional processing steps on the device shown in FIG. 1 resulting in formation of a tunnel dielectric layer and a conductive structure.
Figure 3:
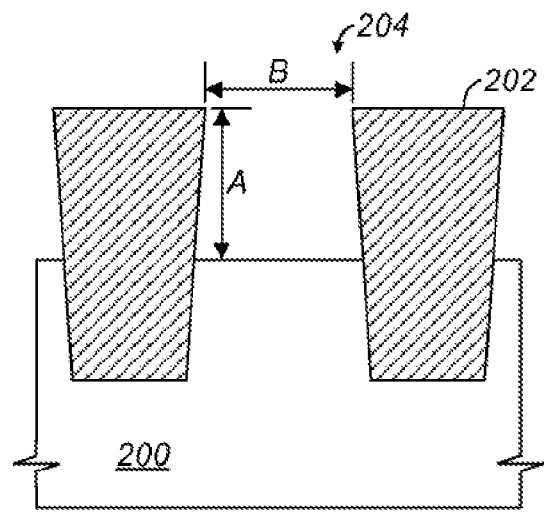
FIG. 3 shows a cross-sectional view of a semiconductor substrate in which a series of field isolation structures have been formed.

FIG. 3 shows a cross-sectional view of a semiconductor substrate 200 in which a series of field isolation structures 202 have been formed. The field isolation structures 202 define a trench 204 corresponding to an active region where a gate structure will be formed. The device shown in FIG. 3 can be formed by known processes. The field isolation structures 202 can be formed of dielectric material, such as a silicon oxide. The shape and aspect ratio (ratio of trench height A to trench width B) of the trench 204 can vary. In the illustrated embodiment, the trench 204 has a high aspect ratio (A/B>1), and the width of the trench 204 increases from the top to the bottom of the trench 204. However, the scope of the present disclosure is not limited to the illustrated aspect ratio or trench shape. While not shown, it will be appreciated by those skilled in the art that the devices shown in FIGS. 3-7 can also include additional structures, such as spacers, buffer layers, diffusion regions, and/or a tunnel dielectric layer such as tunnel dielectric layer 106 shown in FIG. 2.

Figure 4:
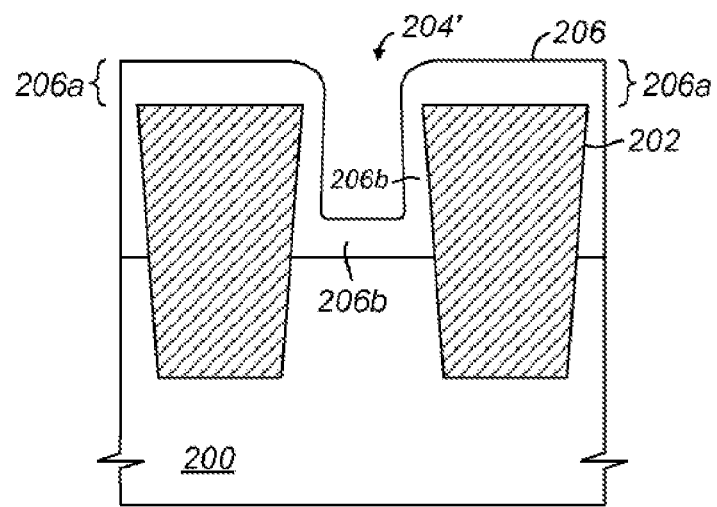
FIG. 4 shows the result of performing a first partial fill-in deposition process on the device shown in FIG. 3.

The device shown in FIG. 3 is subjected to a first partial fill-in deposition process, resulting in the device shown in FIG. 4. The first partial fill-in deposition process includes deposition of polysilicon. The first partial fill-in deposition process results in deposition of a first polysilicon structure 206. Portions of the first polysilicon structure 206 include an upper portion 206a of the polysilicon material that forms a layer above the field isolation structures 202, as well as a trench liner portion 206b that lines the sidewalls and base of the trench 204. Thus, compared to the device shown in FIG. 3, the device shown in FIG. 4 includes a first polysilicon structure 206 that includes the upper portion 206a and the trench liner portion 206b.

The first partial fill-in deposition process results in a first polysilicon structure 206 that preferably has a thickness that is less than half of the trench width B (shown in FIG. 3). The trench 204 is now designated as second trench 204', which is now defined by trench liner portions 206b of the polysilicon structure 206 that line the sidewalls of the field isolation structures 202 and the base of the original trench 204. Thus, the first partial fill-in deposition process can be such that there still exists a trench as second trench 204' that extends between the field isolation structures 202, since the original trench 204 was only partially filled by the first partial fill-in deposition process. Also, the thickness of the trench liner portions 206b near the base of the original trench 204 can be thicker than the thickness of the trench liner portions 206b near the top of the original trench 204 as shown in FIG. 3. In other words, a first thickness of the trench liner portions 206b near a lower extent of the original trench 204 is greater than a second thickness of the trench liner portions 206b near an upper extent of the original trench 204. Additionally, the width of the upper opening of the second trench 204' can be less than the width at the bottom base of the second trench 204' as shown in FIG. 3. In other words, a first width of the second trench 204' near a lower extent of the second trench 204' is greater than a second width of the second trench 204' near an upper extent of the second trench 204'.

Formation of the first polysilicon structure 206 can be accomplished by any of a variety of known deposition processes, including, for example, CVD or dichlorosilane (DCS) processes. Any dopant concentration (no dopant to high dopant) or morphology type (crystal or amorphous) of polysilicon can be used, depending on desired characteristics of the finished device.

Figure 5A:
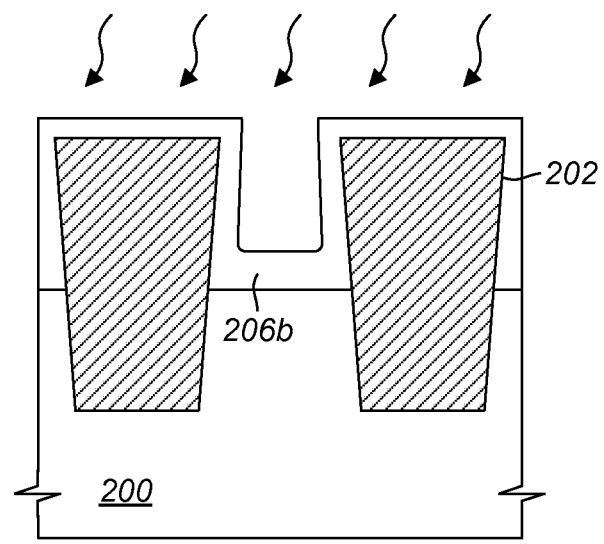
FIGS. 5A and 5B show respective results of performing a first polysilicon removal process on the device shown in FIG. 4 according to whether an upper polysilicon portion is partially or completely removed.
Figure 5B:
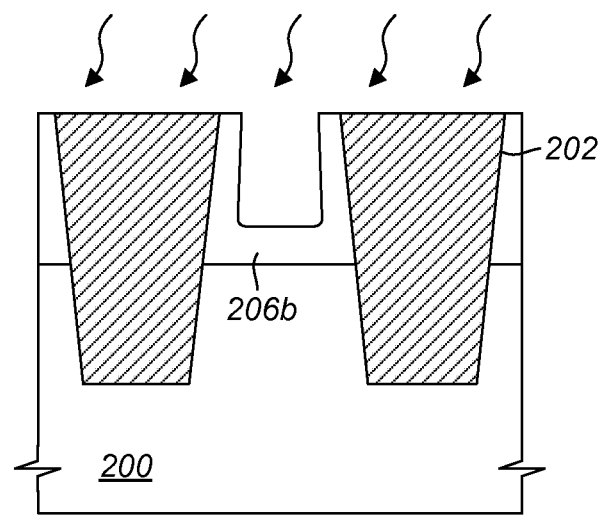

Next, after the first partial fill-in deposition process has been completed, a first material removal process, referred to herein as the first polysilicon removal process, is performed for removing some or all of the upper portion 206a of the first polysilicon structure 206. FIGS. 5A and 5B show respective first and second options for the first polysilicon removal process. FIG. 5A shows the result of the first option, where the first polysilicon removal process results in partial removal of the upper portion 206a of the first polysilicon structure 206. FIG. 5B shows the result of the second option, where the first polysilicon removal process results in complete removal of the upper portion 206a of the first polysilicon structure 206. In general, the first polysilicon removal process preferably results in removal of a thickness of the layer of upper portion 206a that is in a range of B/4 and B/2, where B is the trench width shown in FIG. 3. In either case, whether the first polysilicon removal process is performed as shown in FIG. 5A or FIG. 5B, the trench liner portions 206b preferably remain at least substantially unchanged by the first polysilicon removal process.

The first polysilicon removal process is preferably accomplished by a planarization process, such as polysilicon CMP (Chemical Mechanical Polishing/Planarization). For the polysilicon CMP process, the polishing slurry can be any of a number of known abrasive types of slurry, for example based on $SiO_2$ or $CeO_2$, that is suitable for achieving removal of polysilicon.

Figure 6:
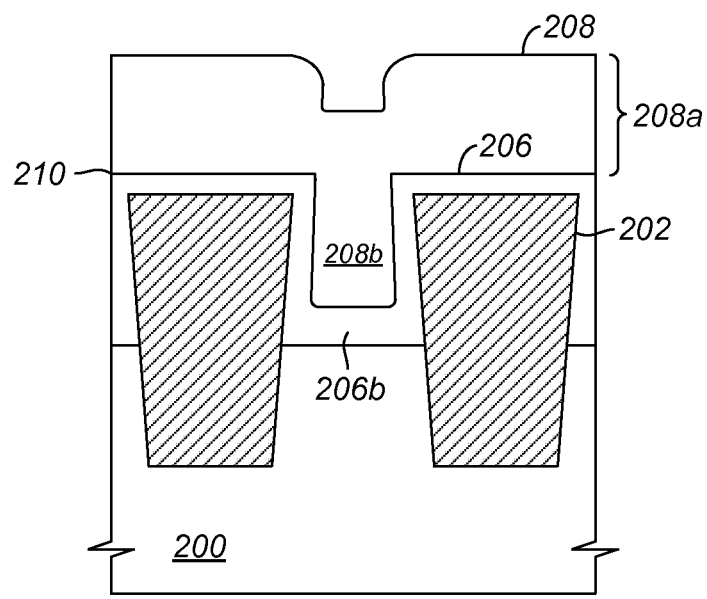
FIG. 6 shows the result of performing a second polysilicon deposition process on the device shown in FIGS. 5A and 5B.

After the first polysilicon removal process has been completed, a second polysilicon deposition process is performed, which results in the device illustrated in FIG. 6. The second polysilicon deposition process includes deposition of polysilicon, preferably the same or similar to the characteristics of the polysilicon used for the first partial fill-in deposition process. The second polysilicon deposition process can thus include deposition of polysilicon directly onto the first polysilicon structure 206. The second polysilicon deposition process results in deposition of a second polysilicon structure 208 over the first polysilicon structure 206. An interface 210 is also thereby formed between the first polysilicon structure 206 and the second polysilicon structure 208. Portions of the second polysilicon structure 208 include an upper portion 208a of the polysilicon material that forms a layer above the field isolation structures 202, as well as a trench plug portion 208b that fills the second trench 204'. Thus, after the second polysilicon deposition process has been performed, the original trench 204 will be filled with polysilicon material deposited by the first and second polysilicon deposition processes. Since the second trench 204' had a smaller aspect ratio compared to the original trench 204, there chance of a defect such as void 110 (shown in FIG. 2) is greatly reduced.

Note that the view shown in FIG. 6 is the result of performing the second polysilicon deposition process after the first polysilicon removal process as shown in FIG. 5A that only partially removed the upper portion 206a of the first polysilicon structure 206. It will be appreciated that a device similar to the one shown in FIG. 6 can be achieved by performing the second polysilicon deposition process after the first polysilicon removal process as shown in FIG. 5B that completely removed the upper portion 206a of the first polysilicon structure 206. That is, if the first polysilicon removal process is performed as shown in FIG. 5B, then the an upper portion 208a of the polysilicon material can form a layer directly on the field isolation structures 202.

Formation of the second polysilicon structure 208 can be accomplished by any of a variety of known deposition processes, including, for example, CVD or dichlorosilane (DCS) processes. Any dopant concentration (no dopant to high dopant) or morphology type (crystal or amorphous) of polysilicon can be used, depending on desired characteristics of the finished device.

Figure 7:
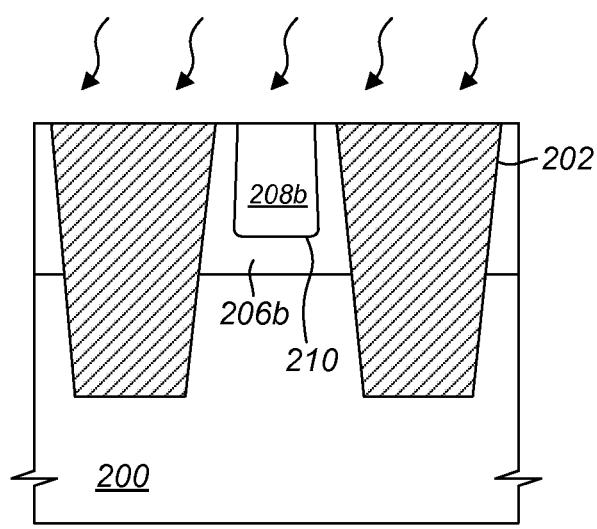
FIG. 7 shows the result of performing a performing a second polysilicon removal process on the device shown in FIG. 6.

Next, after the second polysilicon deposition process has been completed, a second material removal process, referred to herein as the second polysilicon removal process, is performed for removing the upper portion 208a of the second polysilicon structure 208, as well as any remaining upper portion 206a of the first polysilicon structure 206. FIG. 7 shows the result of the second polysilicon removal process. As shown in FIG. 7, the second polysilicon removal process results in complete removal of the upper portion 208a of the second polysilicon structure 208, leaving the trench plug portion 208b in place so that the trench 204 is now filled, and the device is ready for subsequent processing.

This second polysilicon removal process is preferrably accomplished by a planarization process, such as polysilicon CMP (Chemical Mechanical Planarization). For the polysilicon CMP process, the polishing slurry can be any of a number of known abrasive types of slurry, for example based on $SiO_2$ or $CeO_2$, that is suitable for achieving removal of polysilicon.

Figure 8:
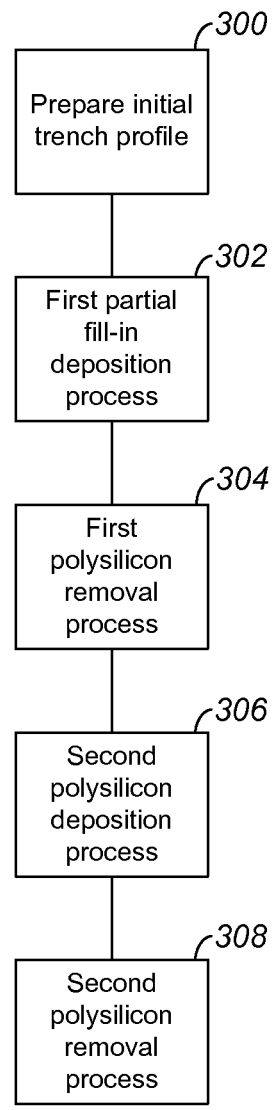
FIG. 8 shows a flowchart that summarizes the process illustrated in FIGS. 3-7.

FIG. 8 shows a flowchart that summarizes the process illustrated in FIGS. 3-7. At block 300, semiconductor substrate 200 is prepared with the trench 204 defined by neighboring field isolation structures 202 as shown in FIG. 3. The field isolation structures 202 can be formed of dielectric material, such as a silicon oxide. The trench 204 can have a high aspect ratio (A/B>1), and the width of the trench 204 can increases from the top to the bottom of the trench 204.

Next, at block 302, the device shown in FIG. 3 is subjected to a first partial fill-in deposition process, resulting in the device shown in FIG. 4. The first partial fill-in deposition process includes deposition of a first polysilicon structure 206. Portions of the first polysilicon structure 206 include an upper portion 206a of the polysilicon material that forms a layer above the field isolation structures 202, as well as a trench liner portion 206b that lines the sidewalls and base of the trench 204. The first partial fill-in deposition process results in a first polysilicon structure 206 that preferably has a thickness that is less than half of the trench width B (shown in FIG. 3). Formation of the first polysilicon structure 206 can be accomplished by any of a variety of known deposition processes, including, for example, CVD or dichlorosilane (DCS) processes. Any dopant concentration (no dopant to high dopant) or morphology type (crystal or amorphous) of polysilicon can be used, depending on desired characteristics of the finished device.

Next, at block 304, after the first partial fill-in deposition process has been completed, a first polysilicon removal process is performed for removing some or all of the upper portion 206a of the first polysilicon structure 206. The first polysilicon removal process can result in a device as shown in FIG. 5A or a device as shown in FIG. 5B depending on whether the upper portion 206a is partially or completely removed. In general, the first polysilicon removal process preferrably results in removal of a thickness of the layer of upper portion 206a that is in a range of B/4 and B, where B is the trench width shown in FIG. 3. In either case, whether the first polysilicon removal process is performed as shown in FIG. 5A or FIG. 5B, the trench liner portions 206b preferrably remain at least substantially unchanged by the first polysilicon removal process. The first polysilicon removal process is preferrably accomplished by a planarization process, such as polysilicon CMP (Chemical Mechanical Polishing/Planarization). For the polysilicon CMP process, the polishing slurry can be any of a number of known abrasive types of slurry, for example based on $SiO_2$ or $CeO_2$, that is suitable for achieving removal of polysilicon.

Next, at block 306, after the first polysilicon removal process has been completed, a second polysilicon deposition process is performed, which results in the device illustrated in FIG. 6. The second polysilicon deposition process includes deposition of a second polysilicon structure 208 that includes an upper portion 208a of the polysilicon material, as well as a trench plug portion 208b that fills the second trench 204'. Thus, after the second polysilicon deposition process has been performed, the original trench 204 will be filled with polysilicon material deposited by the first and second polysilicon deposition processes. Formation of the second polysilicon structure 208 can be accomplished by any of a variety of known deposition processes, including, for example, CVD or dichlorosilane (DCS) processes. Any dopant concentration (no dopant to high dopant) or morphology type (crystal or amorphous) of polysilicon can be used, depending on desired characteristics of the finished device.

Next, as shown at block 308, after the second polysilicon deposition process has been completed, a second polysilicon removal process is performed for removing the upper portion 208a of the second polysilicon structure 208, as well as any remaining upper portion 206a of the first polysilicon structure 206. FIG. 7 shows the result of the second polysilicon removal process. As shown in FIG. 7, the second polysilicon removal process results in complete removal of the upper portion 208a of the second polysilicon structure 208, leaving the trench plug portion 208b in place so that the trench 204 is now filled, and the device is ready for subsequent processing. This second polysilicon removal process is preferrably accomplished by a planarization process, such as polysilicon CMP (Chemical Mechanical Polishing/Planarization). For the polysilicon CMP process, the polishing slurry can be any of a number of known abrasive types of slurry, for example based on $SiO_2$ or $CeO_2$, that is suitable for achieving removal of polysilicon.

Known processes can follow block 308 for manufacturing a semiconductor device from the device shown in FIG. 7. For example, the polysilicon structure formed by the combination of the trench liner portion 206b and the trench plug portion 208b in the trench 204 can be suitable for use as a floating gate, and the device shown in FIG. 7 can be further processed to manufacture a memory device, such as a NOR Flash memory device. The processes disclosed herein are suitable for manufacturing design rules of 75 nm and below.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of forming a semiconductor device comprising:
    forming a first polysilicon structure that includes a trench liner portion and a first upper portion, wherein the trench liner portion only partially fills a first trench between adjacent field isolation structures, thereby resulting in formation of a second trench between the adjacent field isolation structures, the second trench being at least partially defined by portions of the first polysilicon structure;
    removing at least a portion of the first upper portion of the first polysilicon structure;
    forming a second polysilicon structure that includes a trench plug portion and a second upper portion, wherein the trench plug portion fills the second trench; and
    removing the second upper portion of the second polysilicon structure.

2. The method of claim 1, wherein the forming of the first polysilicon structure includes polysilicon deposition.

3. The method of claim 1, wherein the forming of the first polysilicon structure includes forming a layer of polysilicon having a thickness that is less than half a width of the first trench.

4. The method of claim 3, wherein the removing of at least a portion of the first upper portion of the first polysilicon structure includes removing a thickness of the layer of polysilicon that is greater than B/4, where B is representative of the width of the first trench.

5. The method of claim 1, wherein the first upper portion of the first polysilicon structure extends over the adjacent field isolation structures.

6. The method of claim 5, wherein the removing of at least a portion of the first upper portion of the first polysilicon structure results in exposing at least a portion of an upper surface of at least one of the field isolation structures.

7. The method of claim 5, wherein at least some of the first upper portion of the first polysilicon structure remains over at least one of the field isolation structures after the removing of at least a portion of the first upper portion of the first polysilicon structure.

8. The method of claim 1, wherein the removing of at least a portion of the first upper portion of the first polysilicon structure and the removing of the second upper portion of the second polysilicon structure include removal of polysilicon by a Chemical Mechanical Planarization (CMP) process.

9. The method of claim 8, wherein the CMP process includes polishing using a slurry that comprises at least one of Si02 and Ce02.

10. The method of claim 1, wherein the second upper portion extends over the adjacent field isolation structures.

11. The method of claim 10, wherein the removing of at least a portion of the second upper portion of the second polysilicon structure includes removing at least a portion of the first upper portion of the first polysilicon structure.

* * * * *